(12) United States Patent
Tanizawa (10) Patent No.: US 12,439,578 B2
(45) Date of Patent: Oct. 7, 2025

(54) FEEDER MANAGEMENT SYSTEM (71) Applicant: FUJI CORPORATION, Chiryu (JP)

(72) Inventor: Yoshiharu Tanizawa, Toyota (JP)

(73) Assignee: FUJI CORPORATION, Chiryu (JP)

( * ) Notice: Subject to any disclaimer, the term of this patent is extended or adjusted under 35 U.S.C. 154(b) by 266 days.

(21) Appl. No.: 18/261,876

(22) PCT Filed: Jan. 29, 2021

(86) PCT No.: PCT/JP2021/003424
§ 371 (c)(1),
(2) Date: Jul. 18, 2023

(87) PCT Pub. No.: WO2022/162919
PCT Pub. Date: Aug. 4, 2022

(65) Prior Publication Data
US 2024/0076137 A1    Mar. 7, 2024

(51) Int. Cl.
H05K 13/08 (2006.01)
B65G 47/16 (2006.01)
H05K 13/04 (2006.01)

(52) U.S. Cl.
CPC ......... H05K 13/0895 (2018.08); B65G 47/16 (2013.01); H05K 13/043 (2013.01); H05K 13/084 (2018.08)

(58) Field of Classification Search
CPC ............... H05K 13/028; H05K 13/043; H05K 13/0434; H05K 13/084; H05K 13/0895; B65G 47/16
See application file for complete search history.

(56) References Cited

U.S. PATENT DOCUMENTS

| 5,581,486 A * | 12/1996 | Terada ............... H05K 13/0895 700/95 |
| 9,480,195 B2 * | 10/2016 | Kurata .................. H05K 13/08 |
| 10,420,262 B2 * | 9/2019 | Horaguchi ....... G05B 19/41865 |
| 11,010,576 B2 * | 5/2021 | Sugiyama ............ H05K 13/087 |
| 11,445,651 B2 * | 9/2022 | Ao ..................... H05K 13/0895 |
| 11,937,374 B2 * | 3/2024 | Komiyama ........ H05K 13/0895 |

FOREIGN PATENT DOCUMENTS

JP    2011-114084 A    6/2011

OTHER PUBLICATIONS

International Search Report mailed on Apr. 6, 2021 in PCT/JP2021/003424 filed on Jan. 29, 2021, 2 pages).

* cited by examiner

*Primary Examiner* — Gene O Crawford
*Assistant Examiner* — Keith R Campbell
(74) *Attorney, Agent, or Firm* — Oblon, McClelland, Maier &Neustadt, L.L.P.

(57) ABSTRACT

A feeder management system includes a storage section configured to store component information including a type of a component loaded in a bulk feeder and cleaning information providing an execution history of cleaning including, as its cleaning target, at least a conveyance path along which the component is conveyed in the bulk feeder in association with the bulk feeder, and a determination section configured to determine whether the cleaning is executed before an update request for the component information is made based on the cleaning information when the update request for the component information is received.

9 Claims, 5 Drawing Sheets

| FEEDERS (ID) | COMPONENT INFORMATION D1 | | | | CLEANING INFORMATION D2 | |
|---|---|---|---|---|---|---|
| | TYPES | VENDORS | LOTS | REMAINING NUMBERS | TRACK MEMBERS (ID) | COMPONENT CASES (ID) |
| xF11 | Pa | V11 | L11 | N11 | xT21 : IMCOMPLETE | xC31 : IMCOMPLETE |
| xF12 | Pa | V11 | L12 | N12 | xT22 : COMPLETED | NONE |
| xF13 | Pa | V13 | – | N13 | xT23 : IMCOMPLETE | xC31 : IMCOMPLETE |
| xF14 | Pa | V14 | L14 | N14 | xT23 : IMCOMPLETE | xC31 : IMCOMPLETE |
| xF15 | NONE | | | | NONE | NONE |
| xF16 | Pb | V16 | L16 | N16 | xT23 : IMCOMPLETE | xC31 : IMCOMPLETE |
| ⋮ | ⋮ | ⋮ | ⋮ | ⋮ | ⋮ | ⋮ |

FEEDER MANAGEMENT SYSTEM

TECHNICAL FIELD

The present disclosure relates to a feeder management system.

BACKGROUND ART

A feeder management system manages a bulk feeder for supplying components in a bulk state as its management target. The bulk feeder is installed in a component mounter for mounting a component on a board. Patent Literature 1 discloses a configuration for conveying multiple components by vibrating a conveyance path. By performing such a conveyance operation, the bulk feeder supplies components to a supply region which is opened upwards so that a suction nozzle can pick up a component supplied thereto from above.

PATENT LITERATURE

Patent Literature 1: JP-A-2011-114084

BRIEF SUMMARY

Technical Problem

Components supplied by such a bulk feeder are not packaged unlike components accommodated in a carrier tape, and when changing the types of components to be loaded in the bulk feeder, components remaining on a conveyance path which will be no more used must be removed therefrom in an ensured manner. Thus, a feeder management system is required to manage the loading state of components in a bulk feeder.

Solution to Problem

The present description discloses a feeder management system including a storage section configured to store component information including a type of a component loaded in a bulk feeder and cleaning information providing an execution history of cleaning including, as its cleaning target, at least a conveyance path along which the component is conveyed in the bulk feeder in association with the bulk feeder, and a determination section configured to determine whether the cleaning is executed before an update request for the component information is made based on the cleaning information when the update request for the component information is received.

Advantageous Effects

With such a configuration, in the case that an update request for the component information is received, the result of a determination can be obtained which is made on whether the cleaning including at least the conveyance path in its cleaning target is executed. This determination result is useful information in management of the bulk feeder and can serve as, for example, an index of determination on whether loading of a new component can be permitted, or the like. In this way, the feeder management system can manage the loading state of components in the bulk feeder which includes a removing state of components on the conveyance path of the bulk feeder.

DESCRIPTION OF EMBODIMENTS

Referring to accompanying drawings, feeder management system 70 for managing bulk feeder 30 as its management target will described below. Bulk feeder 30 is mounted, for example, in component mounter 10 for mounting components on boards and supplies components in a bulk state (a bulk state in which postures of individual components are irregular).

1. Configuration of Component Mounter 10

Component mounter 10 makes up a production line for producing board products together with multiple types of board work machines including, for example, another component mounter 10. The board work machines making up the production line described above can include a printer, an inspection device, a reflow furnace, and the like.

1-1. Board Conveyance Device

Figure 1:
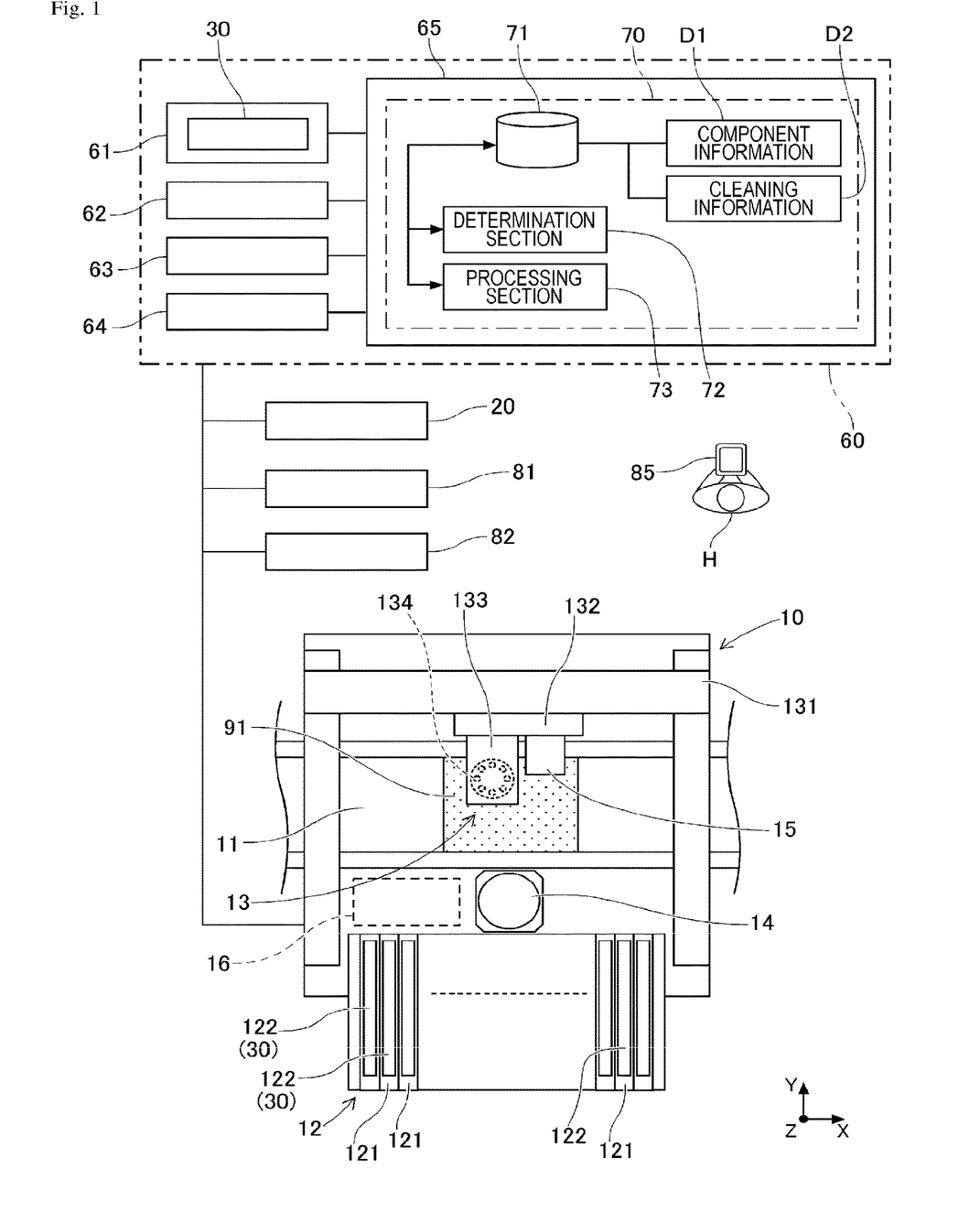
FIG. 1 is a plan view schematically showing functional blocks of a feeder management system and a component mounter which are applied to a production system.

As shown in FIG. 1, component mounter 10 includes board conveyance device 11. Board conveyance device 11 subsequently conveys boards 91 in a conveyance direction and positions those boards 91 individually in a predetermined position in component mounter 10.

1-2. Component Supply Device 12

Component mounter 10 includes component supply device 12. Component supply device 12 supplies components which are mounted on board 91. Component supply device 12 includes feeders 122 which are installed individually in multiple slots 121. For example, a tape feeder that feeds and moves a carrier tape accommodating therein a number of components to supply the components such that the components can be picked up is used for feeder 122. In addition, bulk feeder 30 that supplies components which are accommodated in a bulk state therein such that the components can be picked up is used for feeder 122. Details of bulk feeder 30 will be described later.

1-3. Component Transfer Device 13

Component mounter 10 includes component transfer device 13. Component transfer device 13 transfers a component supplied by component supply device 12 in a predetermined mounting position on board 91. Component transfer device 13 includes head driving device 131, moving body 132, mounting head 133, and suction nozzles 134. Head driving device 131 moves moving body 132 in horizontal directions (an X-direction and a Y-direction) by a linear motion mechanism. Mounting head 133 is detachably fixed to moving body 132 by a clamp member, not shown, and is provided to be movable in the horizontal directions within component mounter 10.

Mounting head 133 supports multiple suction nozzles 134 rotatably while allowing them to be lifted up and lowered. Suction nozzle 134 is a holding member that picks up and holds component 92 supplied by feeder 122. Suction nozzle 134 picks up a component supplied by feeder 122 by means of supplied negative pressure air. As a holding member to be attached to mounting head 133, a chuck or the like can be adopted which holds a component by gripping the component.

1-4. Part Camera 14 and Board Camera 15

Component mounter 10 includes part camera 14 and board camera 15. Part camera 14 and board camera 15 are digital imaging devices having an imaging element, such as CMOS. Part camera 14 and board camera 15 execute imaging based on control signals and send out image data acquired through the imaging. Part camera 14 is configured to image a component held by suction nozzle 134 from below. Board camera 15 is provided on moving body 132 in such a manner as to be movable in the horizontal directions together with mounting head 133. Board camera 15 is configured to image board 91 from above.

Figure 4:
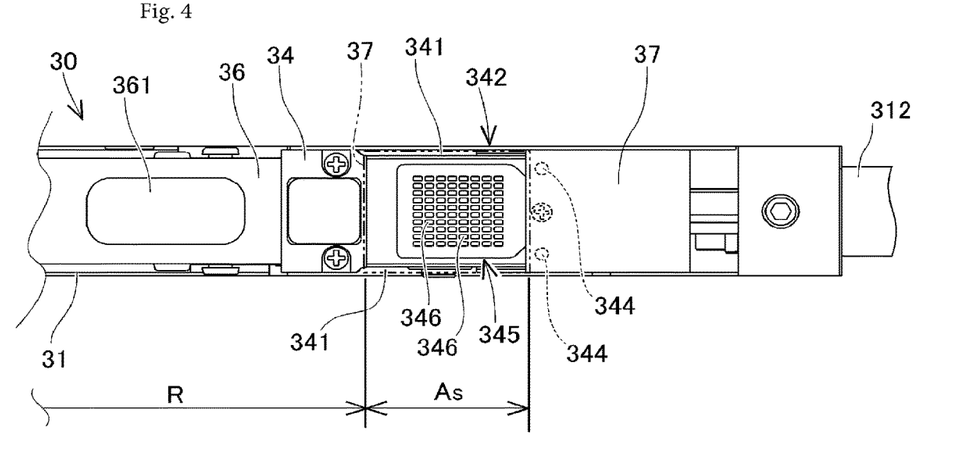
FIG. 4 is a plan view as seen from a direction indicated by an arrow IV in FIG. 2.

Board camera 15 can image a front surface of board 91 as an imaging target and can also image various types of devices additionally as imaging targets as long as those devices fall within a movable range of moving body 132. For example, in the present embodiment, as shown in FIG. 4, board camera 15 can capture an image of supply region As to which bulk feeder 30 supplies component 92 or fiducial marks 344 provided on an upper part of bulk feeder 30 in a visual field thereof for imaging them. Thus, as described above, board camera 15 can double as a camera for imaging different imaging targets in order to acquire image data for use in various image processing.

1-5. Control Device 16

As shown in FIG. 1, component mounter 10 includes control device 16. Control device 16 is made up mainly of CPU and various types of memories, a control circuit, and a storage device. Control device 16 stores various types of data such as a control program used for controlling a mounting process. The control program provides mounting position, mounting angles, and a mounting order of components which are mounted on board 91 in the mounting process.

Control device 16 executes recognition processing of a holding state of a component held by each of the multiple holding members (suction nozzles 134). Specifically, control device 16 executes image processing on image data acquired through imaging by part camera 14 and recognizes a position and an angle of each component with respect to a reference position of mounting head 133. Here, control device 16 may execute image processing on image data acquired by an imaging device provided in addition to part camera 14, for example, a head camera unit provided integrally with mounting head 133 for imaging a component from side, below, or above.

Control device 16 controls a mounting operation of components by mounting head 133 based on the control program to thereby execute the mounting process. Here, the mounting process includes a process of repeating a pick-and-place cycle (a PP cycle) which includes a pickup operation and a mounting operation multiple times. The "pickup operation" described above is an operation in which a component supplied by component supply device 12 is picked up by suction nozzle 134.

In the present embodiment, control device 16 controls the operation of component supply device 12 including bulk feeder 30 in executing the pickup operation described above.

In addition, control device 16 recognizes a supply state of multiple components 92 in supply region As of bulk feeder 30 based on image data acquired through imaging by board camera 15. Recognition processing of the supply state includes a processing step of recognizing whether there exists component 92 that can be picked up in supply region As and a processing step of, if there exists component 92 that can be picked up, recognizing a position and an angle of that existing component 92. Then, control device 16 controls an operation of mounting head 133 in a pickup operation based on the result of the recognition processing of the supply state.

2. Configuration of Production System

The production line including component mounter 10 makes up a production system for producing board products. In the present embodiment, as shown in FIG. 1, the production system includes host computer 20, kitting station 60, feeder warehouse 81, component warehouse 82, and terminal device 85. The configuration of kitting station 60 will be described later.

2-1. Host Computer 20

Host computer 20 supervises and controls the production line including component mounter 10. In addition, host computer 20 is communicably connected to management device 65 of kitting station 60, feeder warehouse 81, and component warehouse 82. Host computer 20 monitors an operation status of the production line and notifies corresponding component mounter 10, terminal device 85 carried by operator H, or the like of a component shortage based on a degree of progress of a mounting process by component mounter 10 or a predetermined remaining number of remaining components in component mounter 10. Operator H is prompted to execute feeding of components, as a result of which an interruption of the mounting process due to a component shortage is prevented.

2-2. Feeder Warehouse 81 and Component Warehouse 82

Feeder warehouse 81 stores feeders 122 such as bulk feeders 30. Component warehouse 82 stores components 92 for use for a mounting process. Component warehouse 82 stores components 92 in, for example, such a state that components 92 are accommodated in a carrier tape which is wound around a reel or that components 92 are accommodated in component case 50 in a bulk state. In addition, feeder warehouse 81 and component warehouse 82 acquire identification information (ID) of feeder 122, a reel, and component case 50 which are carried thereinto and carried thereout to thereby grasp types of components 92 stored therein.

2-3. Terminal Device 85

Terminal device 85 is, for example, a tablet carried by operator H. Terminal device 85 is communicably connected to host computer 20 and management device 65 of kitting station 60. Terminal device 85 displays, for example, various kinds of pieces of information input from host computer 20. In addition, terminal device 85 can receive various types of operations performed by operator H and can make a request for host computer 20 to output predetermined information.

3. Configuration of Bulk Feeder 30

Figure 2:
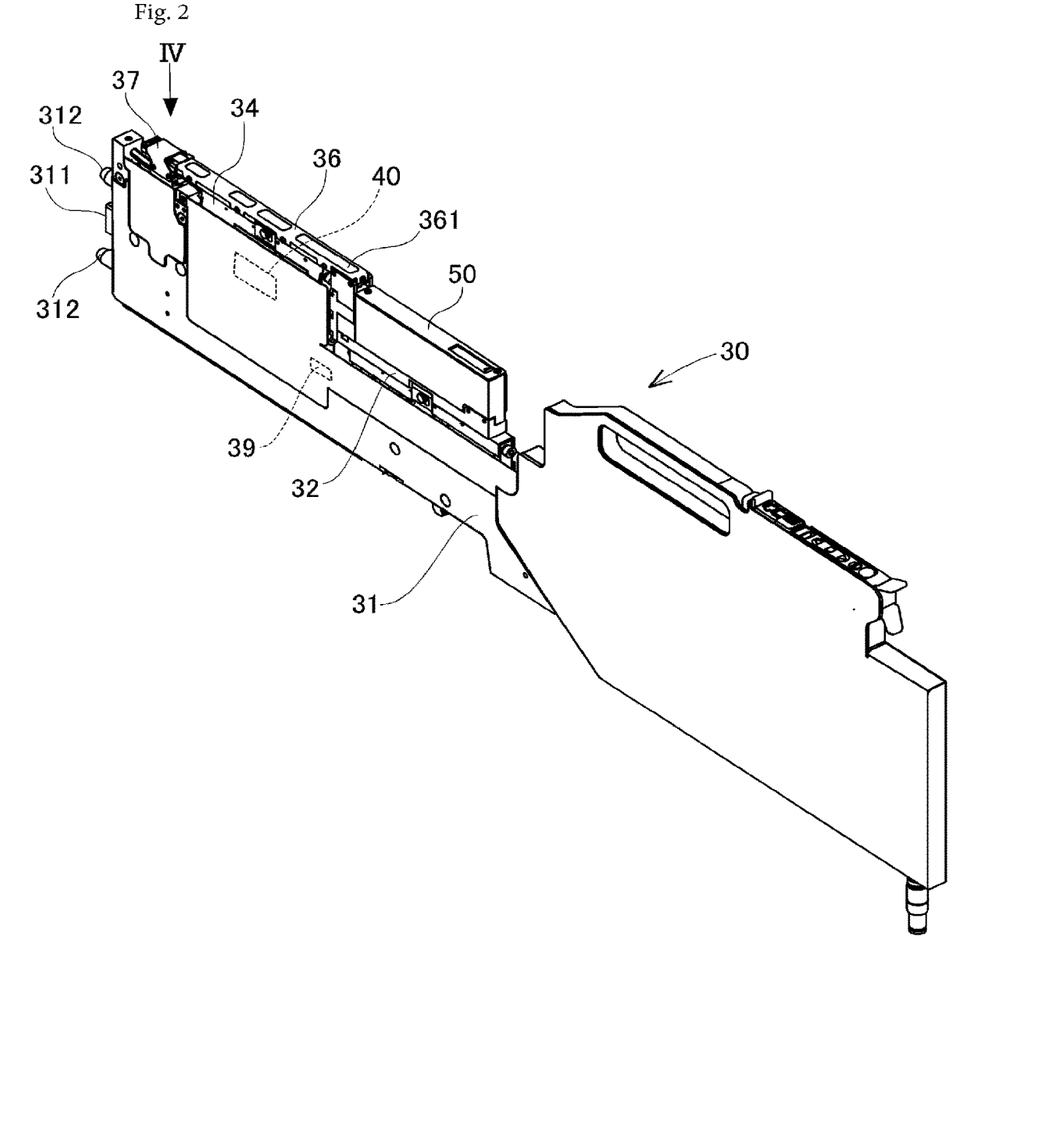
FIG. 2 is a perspective view showing an external appearance of a bulk feeder.

Bulk feeder 30 is installed in component mounter 10 to function as a part of component supply device 12. Bulk feeder 30 supplies components 92 which are accommodated in a bulk state in which components 92 are not aligned as in a carrier tape. As a result, since bulk feeder 30 uses no carrier tape unlike a tape feeder, bulk feeder 30 is advantageous in that loading of a carrier tape, collection of a used carrier tape, and the like can be omitted.

In bulk feeders 30, there is, for example, bulk feeder 30 of a type which supplies components 92 in irregular postures to supply region As which is formed into a flat surface shape. However, in the case that components 92 lie so close to one another to contact, components 92 are built up (a state in which components 92 are superposed one on another in an up-down direction), or components 92 take on a horizontally standing posture in which a transverse or width direction of component 92 is directed in the up-down direction in supply region As, component mounter 10 cannot regard these components 92 as a pickup target. Then, in order to increase a ratio of components 92 that can be picked up, there is bulk feeder 30 of a type that supplies components 92 to supply region As in an aligned state. In the present embodiment, bulk feeder 30 of this type in which components 92 are aligned for supply is taken as an example for description.

3-1. Feeder Main Body 31

As shown in FIG. 2, bulk feeder 30 includes feeder main body 31 which is formed into a flat box shape. Connector 311 and two pins 312 are provided at a front portion of feeder main body 31. When feeder main body 31 is set in slot 121 of component supply device 12, power is supplied thereto via connector 311, whereby feeder main body 31 is put in such a state that feeder main body 31 can communicate with control device 16. Two pins 312 are inserted individually into guide holes provided in slot 121 to thereby be used to position feeder main body 31 when feeder main body 31 is set in slot 121.

3-2. Receiving Member 32

Component case 50 for accommodating multiple components 92 in a bulk state is detachably attached to feeder main body 31 via receiving member 32. Component case 50 is an external device of bulk feeder 30. One component case 50 appropriate to the current or a planned mounting process is selected from various types of component cases 50 for attachment to feeder main body 31. Discharge port 51 for discharging component 92 to the outside of component case 50 is formed in a front portion of component case 50.

Figure 3:
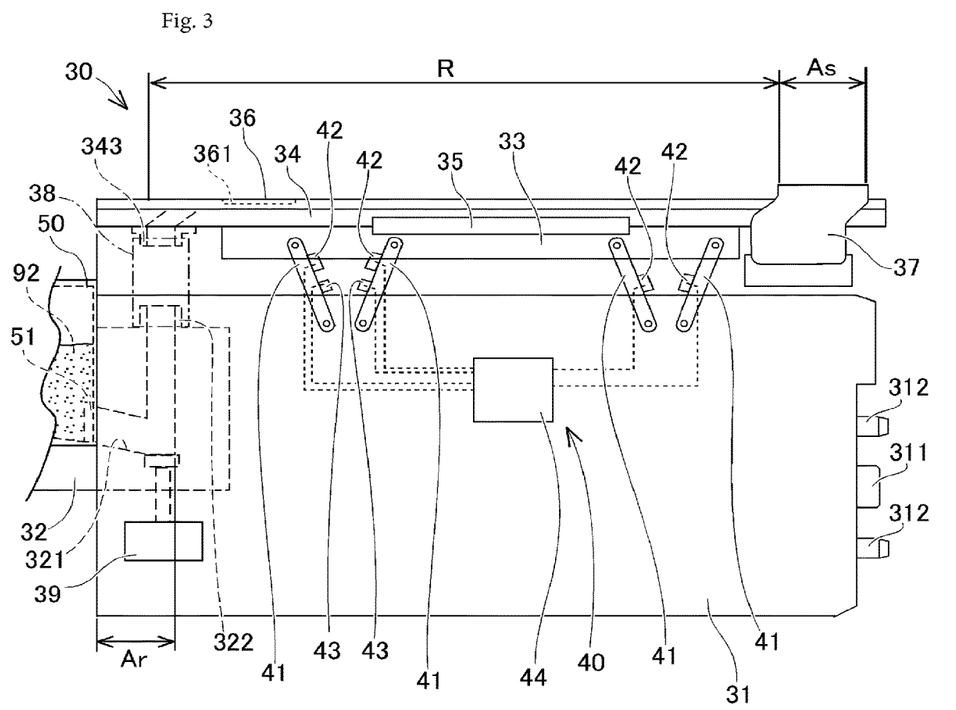
FIG. 3 is a side view schematically showing a main part of the bulk feeder.

Receiving member 32 is provided so as to be able to vibrate with respect to feeder main body 31, and supports component case 50 attached to feeder main body 31. Receiving region Ar for receiving component 92 discharged from component case 50 is formed in receiving member 32. In the present embodiment, receiving member 32 has inclined portion 321 which inclines to a front side with respect to a horizontal plane in receiving region Ar. Inclined portion 321 is located below discharge port 51 of component case 50 and is formed into a flat plane. A flow path for components 92 is formed in receiving member 32 in such a manner as to extend upwards of receiving region Ar, and feed-out section 322 is formed where the flow path is opened upwards.

3-3. Bracket 33, Track Member 34, and Lock Unit 35

Bulk feeder 30 includes bracket 33 and track member 34. Bracket 33 is provided so as to be able to vibrate with respect to feeder main body 31. Bracket 33 is formed into a block shape which extends in a front-rear direction of feeder main body 31, and track member 34 is attached to an upper surface of bracket 33. Bracket 33 is supported by support members 41 of vibration device 40, which will be described later. Conveyance path R on which multiple components 92 are conveyed and supply region As communicating with conveyance path R and opened upwards so as to allow multiple components 92 to be picked up are formed on track member 34.

Bulk feeder 30 includes lock unit 35. Lock unit 35 locks track member 34 in place in such a state that track member 34 is attached to bracket 33. When track member 34 is locked by lock unit 35, track member 34 is then put in a state in which track member 34 vibrates together with bracket 33 with respect to feeder main body 31. When track member 34 is released from the locked state by lock unit 35, track member 34 is then put in a state in which track member 34 can be detached from bracket 33.

3-4. Detailed Configuration of Track Member 34, Cover 36, Shutter 37, and Connection Member 38

Track member 34 is formed in such a manner as to extend in the front-rear direction (a left-right direction in FIG. 4) of feeder main body 31. Pair of side walls 341, which project upwards, are formed along both edges in a width direction (an up-down direction in FIG. 4) of track member 34. Pair of side walls 341 surrounds a circumferential edge of conveyance path R together with distal end portion 342 of track member 34 so as to prevent components 92 which are being conveyed on conveyance path R from escaping therefrom. Pair of left and right circular fiducial marks 344 each indicating a reference position of supply region As is affixed to an upper surface of distal end portion 342.

In the present embodiment, alignment member 345 is attached to track member 34 in such a manner as to be replaced. Alignment member 345 has multiple cavities 346 for individually accommodating multiple components 92. Specifically, multiple cavities 346 are arranged into a matrix configuration in supply region As. For example, alignment member 345 has a total of 80 cavities 346 which are arranged regularly into eight columns in the conveyance direction and 10 rows in a width direction of conveyance path R. Multiple cavities 346 are each opened upwards and accommodate component 92 in such a posture that a thickness direction of component 92 is directed in the up-down direction thereof.

An opening of each cavity 346 is set at such dimensions that the opening becomes slightly larger than an external shape of component 92 in a top view. A depth of each cavity 346 is set in accordance with a type (a shape, a mass, and the like) of component 92. One track members 34 that is selected from various types of track members 34 based on a type of component 92, a required number of cavities 346, and functionality is attached.

Here, "supply region As" of track member 34 denotes a region to which components 92 are supplied in a bulk state and a region where component 92 can be picked up by suction nozzle 134 supported by mounting head 133. In addition, "conveyance path R" of track member 34 denotes a passageway of components 92 on which component 92 which has flowed from receiving region Ar to track member 34 is supplied to supply region As.

Bulk feeder 30 includes cover 36. Cover 36 is fixed to track member 34 and covers conveyance path R thereover. Cover 36 has multiple exhaust ports 361 formed in an upper surface thereof. A mesh material having a mesh size smaller than external dimensions of component 92 is stretched over exhaust port 361. According to this configuration, cover 36 is configured to discharge air from exhaust port 361 to the outside of track member 34 while preventing components 92 from jumping out of conveyance path R.

Bulk feeder 30 includes shutter 37 which is provided on an upper part of track member 34 in such a manner as to open and close an opening of supply region As. Bulk feeder 30 can prevent not only components 92 from jumping out of conveyance path R but also foreign matters from entering supply region As by opening and closing shutter 37. In the present embodiment, shutter 37 is switched between an open state and a closed state by shutter 37 performing an opening and closing operation. The closed state of shutter 37 denotes a state in which shutter 37 contacts track member 34 whereby the opening of supply region As is closed completely. At this time, as indicated by dashed lines in FIG. 4, shutter 37 is located further towards a rear side of feeder main body 31 than pair of fiducial marks 344 affixed to track member 34, whereby pair of fiducial marks 344 becomes visible and can be imaged in a top view.

In addition, the open state of shutter 37 denotes a state in which the opening of supply region As is not closed and hence, a main range (in the present embodiment, a range where multiple cavities 346 are provided) of supply region As is exposed. At this time, suction nozzle 134 can execute a pickup operation of component 92 on any one of cavities 346. Shutter 37 is caused to perform the opening and closing operation by a driving device, not shown, and is put in the closed state or the open state in accordance with a driving state of the driving device.

A flow path of components 92 extending downwards is formed at a rear part of track member 34, and this flow path has introduction section 343 which is opened downwards. Introduction section 343 faces feed-out section 322 of receiving member 32 in the up-down direction. Bulk feeder 30 includes tubular connection member 38. Connection member 38 connects together feed-out section 322 of receiving member 32 and introduction section 343 of track member 34. In the present embodiment, connection member 38 is made up of a tight coil spring and has flexibility as a whole.

With the configuration described heretofore, connection member 38 connects receiving region Ar and conveyance path R in such a manner as to enable multiple components 92 to flow therebetween. In addition, connection member 38 absorbs vibration by deforming in accordance with vibration of receiving member 32 and vibration of track member 34 with respect to feeder main body 31. Connection member 38 alleviates or blocks vibration transmitted between receiving member 32 and track member 34 which vibrate independently of each other.

3-5. Air Supply Device 39

Bulk feeder 30 includes air supply device 39. Air supply device 39 supplies positive pressure air from below receiving region Ar, so that multiple components 92 are enabled to flow from receiving member 32 to track member 34 by way of connection member 38. In the present embodiment, air supply device 39 supplies or shuts off positive pressure air which is supplied from the outside from or at below receiving region Ar based on a command of a feeder control device, not shown.

When air supply device 39 supplies positive pressure air, multiple components 92 remaining in receiving region Ar are blown upwards by the positive pressure air so supplied. The positive pressure air and multiple components 92 so blown up flow sequentially through feed-out section 322 of receiving member 32, connection member 38, and introduction section 343 in that order and eventually arrive at conveyance path R of track member 34. Here, the positive pressure air is discharged to the outside of bulk feeder 30 from exhaust port 361 of cover 36. In addition, multiple components 92 fall onto conveyance path R of track member 34 by their own weights.

3-6. Vibration Device 40

Bulk feeder 30 includes vibration device 40 provided in feeder main body 31. Vibration device 40 applies vibration to track member 34 so that multiple components 92 are conveyed along conveyance path R. Specifically, vibration device 40 has multiple support members 41, multiple piezoelectric elements 42, vibration sensors 43, and power supply device 44. Multiple support members 41 directly or indirectly connect feeder main body 31 and bracket 33 so as to support bracket 33.

Multiple piezoelectric elements 42 are vibrators that vibrate at a frequency corresponding to electric power supplied from power supply device 44. Multiple piezoelectric elements 42 are affixed individually to multiple support members 41. When at least a part of multiple piezoelectric elements 42 vibrate, vibration is applied to track member 34 via bracket 33. In addition, an amplitude of track member 34 changes in accordance with a voltage applied to piezoelectric elements 42. Vibration sensor 43 detects a vibration value indicating a vibration state of track member 34 which is caused to vibrate as a result of vibration generated by vibration device 40 being applied thereto. As the above described vibration value indicating the vibration state, an amplitude, a frequency, or the like can be adopted.

Here, when vibration device 40 applies vibration to track member 34, track member 34 makes an elliptical motion in a side view. As a result, a forward and upward external force or a rearward and upward external force is exerted on multiple components 92 staying on conveyance path R in accordance with a rotational direction of track member 34 which is making the elliptical motion. As a result, multiple components 92 are conveyed to the front side or conveyed to the rear side of track member 34.

Power supply device 44 changes the frequency and the impressed voltage of electric power supplied to piezoelectric elements 42 based on a command from the feeder control device, not shown. As a result, the frequency and amplitude of vibration applied to track member 34 are adjusted, whereby the rotational direction of the elliptical motion of track member 34 is determined. Changing the frequency and amplitude of vibration of track member 34 and the rotational direction of the elliptical motion caused by the vibration changes the conveyance speed of components 92 which are conveyed, the degree to which components 92 scatter, the conveyance direction of components 92, and the like.

When bulk feeder 30 configured as described above is set in slot 121 of component supply device 12, power is supplied to bulk feeder 30 by way of connector 311, and bulk feeder 30 is put in a state in which bulk feeder 30 can communicate with control device 16 of component mounter 10. Various types of data including a program, a conveyance parameter, and the like for use in controlling a component supply process is stored in the feeder control device of bulk feeder 30. In addition, the identification information (ID) of track member 34 and component case 50 which are currently attached to bulk feeder 30 are stored in the feeder control device.

The identification information of track member 34 and component case 50 is such as to be read, for example, during an attachment operation of component case 50 and then to be input to the feeder control device from an external device through communication. In addition to this, individual pieces of identification information may be such as to result from a reader incorporated in bulk feeder 30 reading a reader for reading a code affixed to a predetermined position on track member 34 or component case 50 when track member 34 or component case 50 is attached to bulk feeder 30.

4. Kitting Station 60

4-1. Overview of Kitting Station 60

Kitting station 60 is a work region in which various types of operations are performed which includes setup work for production, a maintenance operation, and the like. Operations to be carried out at kitting station 60 include a loading operation of loading components 92 in feeders 122 and an unloading operation of unloading components 92 from feeders 122. When components 92 are loaded as described above, component information D1 including types of components 92 loaded in feeders 122 are stored in association with feeders 122 in storage section 71, which will be described later.

In the case that feeders 122 are tape feeders, the loading operation of loading components 92 in feeders 122 denotes a setting operation of setting carrier tapes around feeders 122 in such a state that feeders 122 can feed and move the corresponding carrier tapes. In addition, in the case that feeders 122 are bulk feeders 30, new components 92 are loaded in feeders 122 by component case 50 accommodating multiple components 92 in a bulk state being attached to bulk feeder 30. Alternatively, new components 92 are loaded in feeders 122 by supplying multiple components 92 into empty component case 50 which is left attached to bulk feeder 30.

Figure 5:
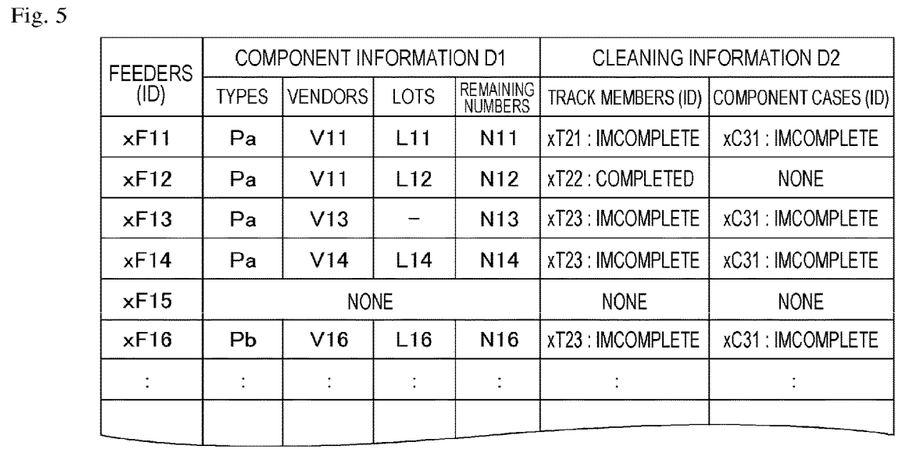
FIG. 5 is a chart showing component information and cleaning information.

FIG. 5 shows component information D1 of components 92 loaded for each identification information (ID) of bulk feeder 30. In FIG. 5, bulk feeder 30 described as "None" in component information D1 is in a state in which no component 92 is loaded therein. In other words, component information D1 associated with bulk feeder 30 is updated every time component 92 is loaded in bulk feeder 30. Here, component information D1 is not discarded as indicating component 92 that was loaded in bulk feeder 30 immediately before even though component 92 is removed or unloaded from bulk feeder 30 (including a case in which component case 50 is removed or unloaded from bulk feeder 30).

4-2. Configuration of Kitting Station 60, Stand 61

Kitting station 60 includes stand 61, cleaner 62, command bar code 63, reader 64, and management device 65. In the present embodiment, feeder management system 70 is incorporated in management device 65. Stand 61 supports feeder 122 set thereon, supplies electric power to feeder 122 so supported, and is communicably connected to management device 65 and a control device of feeder 122.

Here, there may be a case in which operator H executes cleaning of bulk feeder 30 in which no component 92 is loaded at kitting station 60 as setup work or a maintenance operation. Cleaning targets include conveyance path R along which component 92 is conveyed in bulk feeder 30. Performing cleaning removes component 92 and foreign matters from cleaning target portions such as conveyance path R. Here, the cleaning targets include track member 34 on which conveyance path R is formed, alignment member 345 attached to track member 34, receiving member 32, connection member 38, and component case 50.

In bulk feeder 30 of the present embodiment, receiving member 32, track member 34, cover 36, and connection member 38 are treated as vibration units which can be removed from feeder main body 31 and bracket 33. The vibration units are replaced in such a state that the individual members are kept assembled and are given identification information. Operator H executes cleaning by blowing air against or brushing the vibration units or component case 50.

4-3. Cleaner 62, Command Bar Code 63, and Reader 64

Cleaner 62 is configured to be able to automatically perform cleaning on bulk feeder 30 which is mounted in cleaner 62. For example, operator H mounts bulk feeder 30 from which components 92 are removed in cleaner 62, so that cleaning is executed on the cleaning targets (the vibration units and component case 50) including conveyance path R or the like of that bulk feeder 30. Here, in addition to the configuration in which operator H mounts the cleaning target in cleaner 62 as described above, a configuration can be adopted in which cleaner 62 is provided integrally with stand 61 so as to execute cleaning fully automatically.

When cleaning is executed in the way described above, cleaning information D2 which indicates an execution history of cleaning is stored in storage section 71, which will be described later, while being associated with bulk feeder 30. FIG. 5 shows cleaning information D2 which indicates an execution history of cleaning for each identification information (ID) of bulk feeder 30. In the present embodiment, since component case 50 and track member 34 can be removed from feeder main body 31 of bulk feeder 30, an execution history of cleaning is recorded for each of these members which are regarded as separate members.

Specifically, as shown in FIG. 5, cleaning information D2 shows an execution history of cleaning for each identification information (ID) which individually specifies component case 50 and track member 34. Here, in the case that track member 34 constitutes a vibration unit, the identification information of track member 34 substantially corresponds to the identification information of the vibration unit. In FIG. 5, bulk feeder 30 described as "None" in a part of cleaning information D2 is in a state in which component case 50 or the vibration unit is removed from bulk feeder 30 in question or in a state in which component 92 is loaded in bulk feeder 30 in question after cleaning has been executed thereon, causing cleaning information D2 to be discarded.

For example, in the case that the vibration unit including track member 34 is cleaned at kitting station 60, operator H causes reader 64 to read command bar code 63 which notifies management device 65 of the completion of execution of cleaning ("Completed" in FIG. 5). As a result, cleaning information D2 of the vibration unit is transmitted to management device 65 together with identification information (ID) thereof. In addition, in the case that cleaner 62 is used to clean bulk feeder 30, management device 65 records an execution history of cleaning.

Here, in the case that the vibration unit is cleaned in such a state that the vibration unit is disassembled from feeder main body 31, operator H reads an identification code affixed to the vibration unit to denote identification information (ID) of the vibration unit and command bar code 63. As a result, the fact that this vibration unit has been cleaned is recorded, and when this vibration unit is attached to any feeder main body 31, cleaning information D2 associated with the identification information of bulk feeder 30 is updated. The cleaning of the vibration unit and the updating of cleaning information D2 exemplified above are also true in the case that the cleaning target is component case 50.

4-4. Management Device 65

Management device 65 is made up mainly of CPU, various types of memories, and a control circuit. Management device 65 is communicably connected to stand 61, cleaner 62, host computer 20, and terminal device 85, and receives information read by reader 64. Management device 65 monitors various operations carried out at kitting station 60 and controls operations such as a cleaning operation which is carried out by cleaner 62.

5. Feeder Management System 70

Feeder management system 70 manages bulk feeder 30 in the production system as a management target thereof. As described above, components 92 supplied by bulk feeder 30 are not packaged unlike components accommodated in a carrier tape. In a tape feeder, components 92 loaded in a carrier tape can be removed in an ensured fashion by removing the carrier tape, whereas in bulk feeder 30, cleaning needs to be executed to remove components 92 from conveyance path R.

Feeder management system 70 is required to manage a loading state of components 92 in bulk feeder 30. To describe this in detail, in the case that types of components 92 which are loaded in bulk feeder 30 are changed, feeder management system 70 desirably manages the loading state of components 92 so as to prevent components 92 used for the previous mounting process from remaining on conveyance path R to thereby be mixed with components 92 for use for a subsequent mounting process. In the present embodiment, giving attention to these situations, feeder management system 70 is configured to also manage the execution of cleaning on bulk feeder 30, that is, whether cleaning has been executed on bulk feeder 30.

5-1. Storage Section 71

As shown in FIG. 1, feeder management system 70 includes storage section 71. Storage section 71 stores component information D1 and cleaning information D2 while associating them with bulk feeder 30. In the present embodiment, as shown in FIG. 5, component information D1 includes, in addition to types of the components 92, information for specifying vendors and lots of components 92 and the remaining numbers of components 92. Vendors of components 92 are suppliers who manufacture components 92. Lots of components 92 are units of identical types of components 92 which are divided based on manufacturing periods of time or the like. The remaining numbers of components 92 are approximate numbers and are recorded while reducing the numbers of components 92 used for supply from, for example, initial values.

As shown in FIG. 5, cleaning information D2 includes an execution history of cleaning for each of pieces of identification information (ID) which individually specifies track member 34 and component case 50. Storage section 71 stores component information D1 and cleaning information D2 while associating them with unique identification information (ID) for each bulk feeder 30. Component information D1 is updated when components 92 are loaded into bulk feeder 30. Cleaning information D2 is associated with track member 34 and component case 50, and cleaning information D2 is updated when cleaning is executed on track member 34 and component case 50 or track member 34 and component case 50 are attached to feeder main body 31, and is discarded when track member 34 and component case 50 are removed from feeder main body 31 or components 92 are loaded in bulk feeder 30.

5-2. Determination Section 72

As shown in FIG. 1, feeder management system 70 includes determination section 72. In the case that feeder management system 70 receives a request for updating component information D1, determination section 72 determines whether cleaning has been executed before the request for updating component information D1 is made based on cleaning information D2. In the present embodiment, in the case that new components 92 are loaded in bulk feeder 30, feeder management system 70 receives a request for updating component information D1 for those components 92 which are associated with bulk feeder 30 in question.

Specifically, in the case that component case 50 accommodating therein new components 92 is attached to bulk feeder 30 at kitting station 60, operator H causes reader 64 to read an identification code of component case 50 in question. As a result, feeder management system 70 acquires component information D1 of components 92 accommodated in that component case 50. Then, assuming that these components 92 are loaded into bulk feeder 30, feeder management system 70 receives an update request as an update request for that component information D1 of those components 92 accommodated in component case 50 in question.

In addition to the attachment of component case 50 described above, the same is also equally applied to a case in which new components 92 are fed from a component pack accommodating a number of components 92 into empty component case 50. In other words, in the case that an identification code affixed to the component pack is read, assuming that components 92 in the component pack are loaded into empty component case 50, feeder management system 70 receives an update request as an update request for component information D1 of those components 92.

In addition, when receiving an update request for component information D1, determination section 72 executes determination processing based on cleaning information D2. In this determination processing, determination section 72 determines whether cleaning has been performed before the update request for component information D1 is made. As will be described later, the result of the determination so made becomes useful information in management of bulk feeder 30, for example, as in a case in which the result of the determination is used as an index of determination on whether the loading of new components 92 can be permitted. In this way, feeder management system 70 can manage the loading state of components 92 in bulk feeder 30 including a removal state of components 92 on conveyance path R of bulk feeder 30.

5-3. Processing Section 73

As shown in FIG. 1, feeder management system 70 includes processing section 73. Processing section 73 regulates updating of component information D1 in the case that determination section 72 determines that cleaning has not yet been executed. In addition, in the present embodiment, processing section 73 notifies an outside device of cleaning incompleteness in the case that processing section 73 regulates updating of component information D1. Specifically, processing section 73 notifies a display device of management device 65 or terminal device 85 of cleaning incompleteness and causes the display device or terminal device 85 to display a warning that bulk feeder 30 into which components 92 are attempted to be loaded has not yet been cleaned.

As a result, operator H is prompted to execute required cleaning. Then, when command bar code 63 is read after the required cleaning has been executed, cleaning information D2 is updated. In addition, in the case that cleaner 62 is configured to automatically execute cleaning at kitting station 60, processing section 73 may instruct cleaner 62 to execute cleaning. As a result, cleaning is automatically executed, and when receiving a notification from cleaner 62 thereafter, processing section 73 updates cleaning information D2.

Then, assuming that feeder management system 70 receives an update request for component information D1 again, feeder management system 70 causes determination section 72 to execute determination processing based on cleaning information D2 so updated. When determination section 72 determines from the result of the determination processing that cleaning has been executed, processing section 73 updates component information D1. As a result, new component information D1 is associated with bulk feeder 30, and processing section 73 records a status in which components 92 corresponding to that new component information D1 are now loaded in bulk feeder 30 in question. Processing section 73 discards cleaning information D2 on bulk feeder 30 in question as those new components 92 are loaded therein.

6. Feeder Management Processing

Figure 6:
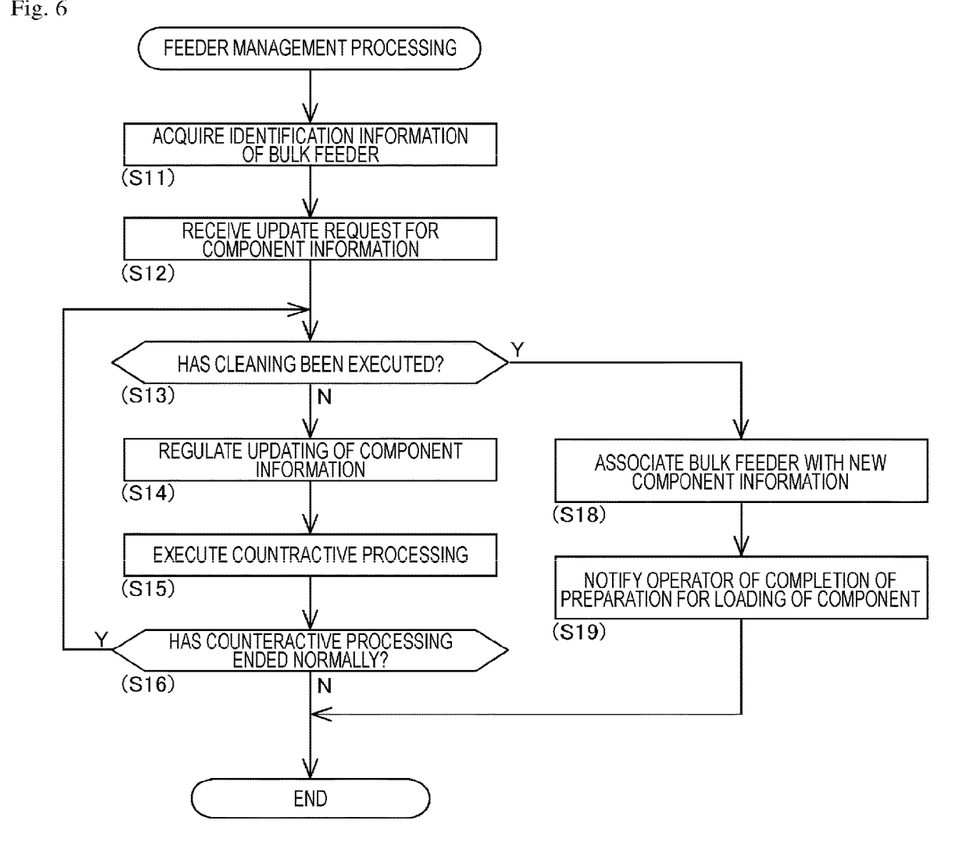
FIG. 6 is a flowchart showing feeder management processing.
Figure 7:
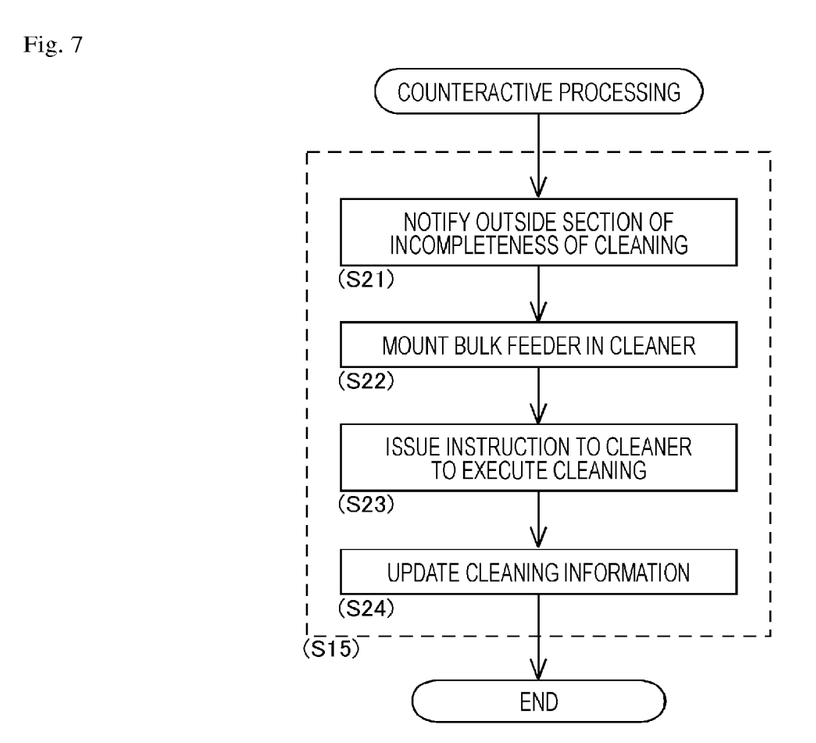
FIG. 7 is a flowchart showing counteractive processing shown in FIG. 6.

Referring to FIGS. 6 and 7, feeder management processing executed by feeder management system 70 will be described below. Let's assume that operator H executes a loading operation of loading components 92 in bulk feeder 30 as setup work for production of board products. First, when operator H mounts bulk feeder 30 on stand 61, management device 65 acquires identification information of bulk feeder 30 in question through communication with that bulk feeder 30 (S11).

Subsequently, when an identification code of component case 50 which is attached to bulk feeder 30 is read by reader 64, feeder management system 70 receives an update request for component information D1 (S12). Determination section 72 determines whether to permit updating of component information D1 (S13). Specifically, determination section 72 compares new component information D1 with immediately preceding component information D1, and executes determination processing by reference to cleaning information D2 if the types of components 92 are different. If cleaning has been executed (S13: Yes), determining section 72 permits the updating of component information D1.

On the other hand, if cleaning has not yet been executed (S13: No), processing section 73 regulates updating of component information D1 (S14). Here, in the determination processing (S13), determination section 72 may refer to cleaning information D2 if the types of components 92 are different, whereas if the types of components 92 are the same, determination section 72 may permit the updating of component information D1. As yet another aspect, in the determination processing (S13), if vendors or lots of components 92 are different although the types of components 92 are the same, too, determination section 72 may refer to cleaning information D2 to make a determination based on whether an execution history of cleaning exists.

Here, if vendors or lots of components 92 are different although types of components 92 are the same, there may be a case in which the property of component 92 changes, resulting in a risk of a mounting process being affected. Then, in order to prevent a mixture of components 92 from different vendors or lots, the determination processing may also reflect them. The determination processing may be desirably set to reflect any, some, or all of types, vendors, and lots of components 92. Irrespective of whether types of components 92 are the same or different, determination section 72 may refer to cleaning information D2 at all times to make a determination based on whether an execution history of cleaning exists.

Processing section 73 regulates updating of component information D1 (S14), and executes counteractive processing (S15). Specifically, as shown in FIG. 7, processing section 73 first notifies the outside device of cleaning incompleteness (S21). As a result, operator H is prompted to execute cleaning, and mounts bulk feeder 30 in cleaner 62 (S22). Processing section 73 issues an instruction to cleaner 62 to execute cleaning (S23). Processing section 73 updates cleaning information D2 after cleaner 62 has finished cleaning bulk feeder 30 (S24). In the case that cleaning of bulk feeder 30 is executed through a manual operation by operator H, only a notification processing (S21) is executed, and command bar code 63 is read after cleaning has been executed to update cleaning information D2.

If the counteractive processing (S15) does not ends normally since the counteractive processing (S15) is not executed appropriately (S16: No), the feeder management processing ends without permitting an update request for component information D1. On the other hand, if the counteractive processing (S15) ends normally (S16: Yes), assuming that feeder management system 70 receives an update request for component information D1 again, feeder management system 70 resumes the execution of the determination processing (S13). Determination section 72 determines that cleaning has been executed (S13: Yes), and permits updating of component information D1.

Processing section 73 associates bulk feeder 30 with new component information D1 in order to update component information D1 (S18). In addition, assuming that components 92 are going to be loaded in bulk feeder 30, processing section 73 discards cleaning information D2 as those components 92 are loaded in bulk feeder 30 in question. Processing section 73 notifies operator H that a preparation is completed for loading components 92 associated with component information D1 for which feeder management system 70 receives an update request (S19). As a result, operator H performs an attachment operation of component case 50 to bulk feeder 30. Operator H removes bulk feeder 30 from stand 61, and mounts bulk feeder 30 in question in predetermined slot 121 in component mounter 10.

According to the configuration of feeder management system 70 described heretofore, in the case that there is an update request for component information D1, the result of the determination on whether cleaning including at least conveyance path R in its cleaning targets has been executed can be obtained. This determination result can constitute an index of determination on whether loading of new components 92 can be permitted to thereby prevent the occurrence of a mixture of different types of components 92 in bulk feeder 30, thereby making it possible to increase the manageability of loading states.

7. Modified Aspect of Embodiment 7-1. As to Feeder Management System 70

In the present embodiment, the configuration is illustrated in which individual sections 71-73 (storage section 71, determination section 72, and processing section 73) of feeder management system 70 are incorporated in management device 65 of kitting station 60. In contrast to this, a configuration may be adopted in which a part or the whole of individual sections 71 to 73 are incorporated in an external device of management device 65. For example, individual sections 71-73 may be incorporated in host computer 20, terminal device 85, or other dedicated device with which management device 65 is communicably connected. Either of the aspects described above exhibits the same advantageous effects as those provided by the embodiment.

In addition, there may be a case in which the loading operation of loading components 92 in bulk feeder 30 is carried out at any other location than kitting station 60. For example, there is a case in which components 92 are loaded in bulk feeder 30 on a wheeled table that conveys bulk feeder 30 between feeder warehouse 81 or component warehouse 82 and the production line. In addition, there is a case in which components 92 are loaded in bulk feeder 30 by exchanging component cases 50 or by supplying components 92 to component case 50 attached to feeder main body 31 in such a state that bulk feeder 30 is mounted in slot 121 in component mounter 10. In the various types of loading work described above, the same advantageous effects as those provided by the present embodiment are provided by executing determination processing on whether to permit or prohibit updating of component information D1 based on cleaning information D2 when an update request for component information D1 is received.

REFERENCE SIGNS LIST

10: component mounter, 12: component supply device, 121: slot, 122: feeder, 20: host computer, 30: bulk feeder, 31: feeder main body, 32: receiving member, 33: bracket, 34: track member, 35: lock unit, 36: cover, 37: shutter, 38: connecting member, 39: air supply device, 40: vibration device, 50: component case, 60: kitting station, 61: stand, 62: cleaner, 63: command bar code, 64: reader, 65: management device, 70: feeder management system, 71: storage section, 72: determination section, 73: processing section, D1: component information, D2: cleaning information.

The invention claimed is:

1. A feeder management system comprising:
a storage section configured to store component information including a type of a component loaded in a bulk feeder and cleaning information providing an execution history of cleaning including, as its cleaning target, at least a conveyance path along which the component is conveyed in the bulk feeder in association with the bulk feeder; and
a determination section configured to determine whether the cleaning is executed before an update request for the component information is made based on the cleaning information when the update request for the component information is received.

2. The feeder management system according to claim 1, further comprising:
a processing section configured to regulate updating of the component information when the determination section determines that the cleaning has not yet been executed.

3. The feeder management system according to claim 2, wherein when the processing section regulates updating of the component information, the processing section notifies an outside section of incompleteness of the cleaning.

4. The feeder management system according to claim 2, wherein the processing section issues an instruction to a cleaner configured to execute the cleaning on the bulk feeder mounted therein to execute the cleaning.

5. The feeder management system according to claim 4, wherein the processing section updates the component information and the cleaning information when the cleaning is executed by the cleaner.

6. The feeder management system according to claim 1, wherein when the component is newly loaded in the bulk feeder, the feeder management system receives an update request for the component information on the component which is associated with the bulk feeder.

7. The feeder management system according to claim 1, wherein the new components are loaded in the bulk feeder by a component case accommodating therein the multiple components in a bulk state being attached to the bulk feeder or by the multiple components being supplied to the component case.

8. The feeder management system according to claim 1, wherein the component information includes information configured to specify a vendor or a lot of the component.

9. The feeder management system according to claim 1, wherein a component case for accommodating the multiple components in a bulk state and a track member on which the conveyance path is formed are both detachably attached to the bulk feeder, and
wherein the cleaning information includes execution histories of cleaning for individual pieces of identification information configured to specify the component case and track member individually.

* * * * *